(12) United States Patent
Cen et al.

(10) Patent No.: US 11,380,536 B2
(45) Date of Patent: Jul. 5, 2022

(54) MULTI-STEP PRE-CLEAN FOR SELECTIVE METAL GAP FILL

(71) Applicant: Applied Materials, Inc., Santa Clara, CA (US)

(72) Inventors: Xi Cen, San Jose, CA (US); Yakuan Yao, Campbell, CA (US); Yiming Lai, San Jose, CA (US); Kai Wu, Palo Alto, CA (US); Avgerinos V. Gelatos, Scotts Valley, CA (US); David T. Or, Santa Clara, CA (US); Kevin Kashefi, San Ramon, CA (US); Yu Lei, Belmont, CA (US); Lin Dong, San Jose, CA (US); He Ren, San Jose, CA (US); Yi Xu, San Jose, CA (US); Mehul Naik, San Jose, CA (US); Hao Chen, Santa Clara, CA (US); Mang-Mang Ling, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/867,554

(22) Filed: May 5, 2020

(65) Prior Publication Data
US 2021/0351032 A1    Nov. 11, 2021

(51) Int. Cl.
*H01L 21/02* (2006.01)
*H01L 21/67* (2006.01)
*H01L 21/768* (2006.01)

(52) U.S. Cl.
CPC .... *H01L 21/02063* (2013.01); *H01L 21/0234* (2013.01); *H01L 21/02244* (2013.01); *H01L 21/02334* (2013.01); *H01L 21/67167* (2013.01); *H01L 21/67207* (2013.01); *H01L 21/76814* (2013.01); *H01L 21/76879* (2013.01)

(58) Field of Classification Search
None
See application file for complete search history.

(56) References Cited

U.S. PATENT DOCUMENTS

| | | |
|---|---|---|
| 5,071,788 A | 12/1991 | Joshi |
| 5,084,417 A | 1/1992 | Joshi et al. |
| 9,613,854 B2 | 4/2017 | Yang et al. |
| 10,475,655 B2 | 11/2019 | Hung et al. |
| 10,559,497 B2 | 2/2020 | Wu et al. |
| 11,124,874 B2 | 9/2021 | Chung et al. |
| 2007/0184666 A1* | 8/2007 | Smith ............... H01L 21/76814 438/723 |
| 2008/0122102 A1* | 5/2008 | Sakata .................. C23C 16/482 257/763 |
| 2015/0126027 A1* | 5/2015 | Matsumoto ....... H01L 21/76802 438/652 |

(Continued)

*Primary Examiner* — Alexander G Ghyka
(74) *Attorney, Agent, or Firm* — Servilla Whitney LLC

(57) ABSTRACT

Methods for pre-cleaning substrates having metal and dielectric surfaces are described. The substrate is exposed to a strong reductant to remove contaminants from the metal surface and damage the dielectric surface. The substrate is then exposed to an oxidation process to repair the damage to the dielectric surface and oxidize the metal surface. The substrate is then exposed to a weak reductant to reduce the metal oxide to a pure metal surface without substantially affecting the dielectric surface. Processing tools and computer readable media for practicing the method are also described.

18 Claims, 5 Drawing Sheets

(56) References Cited

U.S. PATENT DOCUMENTS

| | | | |
|---|---|---|---|
| 2018/0286669 A1* | 10/2018 | Mallick | C23C 16/50 |
| 2020/0043776 A1* | 2/2020 | Hausmann | H01L 21/02074 |
| 2020/0234943 A1 | 7/2020 | Bhuyan et al. | |
| 2020/0343135 A1* | 10/2020 | Huang | H01L 21/76825 |
| 2020/0350204 A1* | 11/2020 | Yu | H01L 21/76826 |
| 2021/0159070 A1* | 5/2021 | Xu | B08B 7/0035 |

* cited by examiner

210

⇩ 220

MULTI-STEP PRE-CLEAN FOR SELECTIVE METAL GAP FILL

TECHNICAL FIELD

Embodiments of the disclosure generally relate to methods for filling gaps in semiconductors. In particular, embodiment of disclosure relate to methods for pre-cleaning a substrate to improve metal deposition selectivity.

BACKGROUND

Interconnect metallization is widely used in logic and memory devices. A liner film followed by a bulk-deposited CVD/PVD film is typically used for via/trench gap fill applications. However, as the feature size decreases, the via/trench structures become smaller and the volume ratio of liner film increases, making it difficult to achieve defect free and low resistivity metal gap fill.

A selective deposition process takes advantage of an incubation difference on one surface material versus another surface material during deposition. This incubation delay could be leveraged to enable bottom-up gap fill without seam/void and liner film. However, there are several challenges that prevent this technique from broader application. One of most serious issues comes from the impurities on the via bottom and dielectric surface that reduce the selectivity of a selective metal growth on metal surface versus dielectric field. Current processes employ a single gas preclean (e.g., $H_2$ plasma or Ar plasma) to clean surface contaminants (e.g., oxygen, carbon, fluorine, chlorine) the surface of metal bottom to shorten the incubation. However, Ar plasma can easily cause sputtering that contributes to selectivity loss on the sidewall of the feature (trench or via). Hydrogen ($H_2$) plasma can be used to clean fluorine, chorine and oxygen contaminants from a metal surface, but not efficient enough to remove carbon contaminants. More aggressive hydrogen/argon ($H_2$/Ar) plasma results in defects and eventually causes selectivity loss on the field surface.

In general, cleaning the metal surface efficiently while still maintaining no or minimal growth on the field is a major challenge preventing widespread use. With single-step pre-clean processes, the selectivity window is not robust enough for a broader application. For instance, different surface structures with different etch residues or contaminants may need different pre-clean processes to enable selective growth.

Additionally, current selective metal deposition processes often have very narrow selectivity windows between selectivity loss (field damage) and via bottom cleaning efficiency. This narrow window limits the processes to only one or two applications.

Accordingly, there is an ongoing need in the art for improved methods and apparatus to pre-clean substrate surfaces for selective deposition.

SUMMARY

One or more embodiments of the disclosure are directed to methods of pre-cleaning a substrate. A substrate comprising a surface structure with a metal bottom with surface contaminants and dielectric sidewalls and field is exposed to a strong reductant to remove the oxide and/or nitride from a pure metal bottom and create surface defects in the sidewalls and/or field of the dielectric. The substrate is exposed to a oxidizer to repair the surface defects in the sidewalls and/or field of the dielectric and oxidize the metal bottom of the structure to form a metal oxide bottom of the structure. The substrate is exposed to a weak reductant to reduce the metal oxide bottom to a metal bottom without substantially damaging the dielectric.

Additional embodiments of the disclosure are directed to processing tools comprising a central transfer station including a robot configured to move a substrate between process chambers. A first process chamber is connected to the central transfer station and is configured to perform a strong reduction process to remove surface contaminants from a metal surface and create defects in a dielectric sidewall. A second process chamber is connected to the central transfer station and is configured to perform an oxidation process to repair defects in the dielectric sidewall and oxidize the metal surface to form a metal oxide. A third process chamber is connected to the central transfer station and is configured to perform a weak reduction process to reduce the metal oxide to pure metal without substantially damaging the dielectric. At least one controller is connected to the central transfer station, the first process chamber, the second process chamber and the third process chamber. The at least one controller has one or more configurations selected from: a configuration to move a substrate between and among the central transfer station, the first process chamber, the second process chamber and the third process chamber; a configuration to perform the strong reduction process in the first process chamber; a configuration to perform the oxidation process in the second process chamber; and a configuration to perform the weak reduction process in the third process chamber.

Further embodiments of the disclosure are directed to non-transitory computer readable medium, including instructions, that, when executed by a controller of a processing chamber, causes the processing chamber to perform operations of: moving a substrate between and among the central transfer station, a first process chamber, a second process chamber and a third process chamber; perform a strong reduction process in the first process chamber; perform an oxidation process in the second process chamber; and perform a weak reduction process in the third process chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
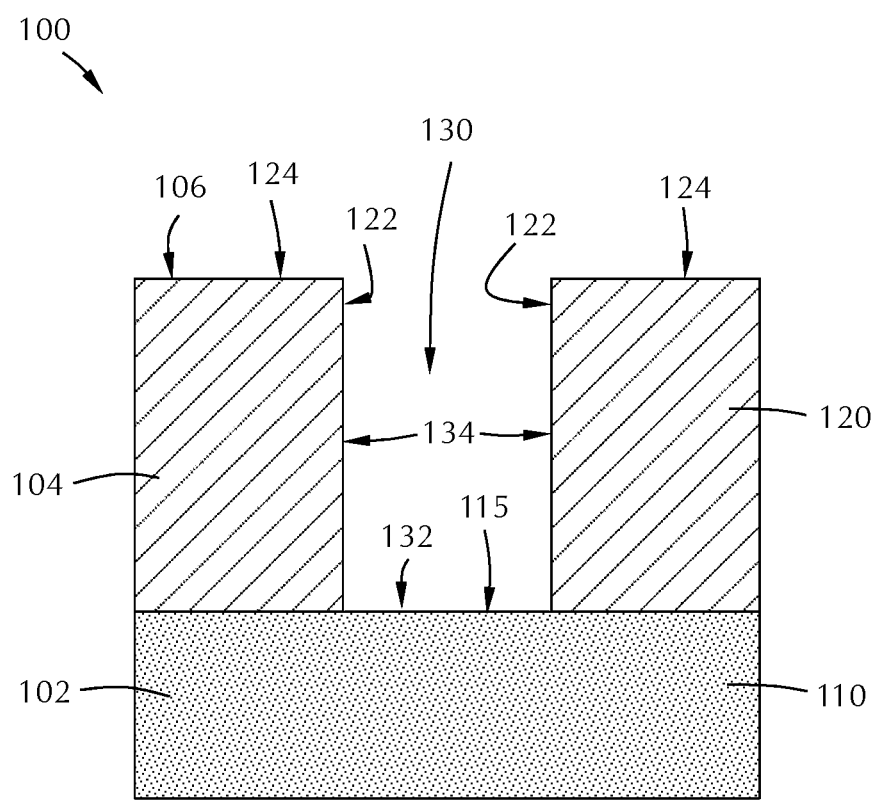
FIG. 1 shows a schematic representation of a substrate structure in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiments of the disclosure advantageously provide methods for selective deposition which can target potential more applications. Some embodiments advantageously provide methods for pre-cleaning a substrate for a wider range of structure types and selectivity windows. Some embodiments advantageously provide a sequence of process steps to effectively clean metals (e.g., tungsten, cobalt) of surface contaminants while maintaining sidewall/top field dielectric selectivity.

Some embodiments of the disclosure methods for selective metal deposition processes in contacts or via bottoms which require a clean surface to start with for minimum incubation. In some embodiments, metal oxide/metal nitride/metal carbide, etc., contaminants, which may hinder the selective deposition process and cause significant incubation delay, are removed. Some embodiments can effectively clean metal contaminants while keeping contact/via structure preferable for selective process.

One or more embodiments of the disclosure use a sequence of thee process steps with different purposes targeting different contaminants using oxidation and reduction reactions. Some embodiments use two hydrogen reduction processes with an oxidation between. Some embodiments advantageously provide methods capable of cleaning metal contaminants (e.g., metal oxide, metal nitride) effectively with the two hydrogen reduction steps and one oxidation step in between. Some embodiments advantageously maintain the dielectric selectivity for down-stream selective deposition processes. For example, some embodiments prevent metal deposition on the dielectric sidewall/field of the substrate.

Some embodiments of the disclosure provide relatively low temperature oxidation processes. Some embodiments oxidize at sufficiently low temperatures to be usable with different metal surfaces (e.g., tungsten, cobalt).

In an exemplary non-limiting embodiment, the cleaning process sequence comprises: (1) Exposure to a hydrogen inductively coupled plasma (ICP) plasma at 400° C.-450° C. In some embodiments, this step involves high density hydrogen plasma to reduce major metal contaminant—i.e. metal oxide and metal nitride reduction to pure metal. The majority of the metal compounds are expected to be reduced by this step and only a small fraction of contaminants will be left for further treatment; (2) a low temperature (−15° C.-180° C.) oxidation process which can convert residual metal nitrides to oxides, which can be reduced to pure metal in the next step, and/or oxidize the sidewall and top field dielectric materials (oxide and nitride) which are damaged during the initial strong hydrogen plasma process. In some embodiments, the oxidation process repairs the dielectric surface with strong oxidation, maintaining high selectivity for selective metal deposition. One advantage of this process is that low temperature process will not cause excessive oxidation on some metals like cobalt (Co), and therefore, the oxidized metal can be later reduced to pure metal; and (3) a second hydrogen plasma process (e.g., at 400° C.-450° C.) conductively coupled plasma (CCP) process that, in some embodiments, reduces the metal oxides to pure metal. The process of some embodiments is performed at a pressure range of about 5-20 Torr. In some embodiments, the relative low plasma density of CCP gently finishes the metal reduction without significant impact on the dielectrics. After the second reducing process, the contact/via bottom of some embodiments is a pure metal, ready for selective deposition process and the sidewall/top field dielectric remains selectively inert to the selective deposition, maintaining a bottom up growth in the whole structure.

A single-step pre-clean does not fulfill requirement for some selective metal depositions. Some embodiments incorporate an effective cleaning (aggressive $H_2$ or Ar plasma) that can easily cause damage and selective loss on the dielectric field. Hence, embodiments of the disclosure provide multi-step pre-clean approach that can widen up selectivity window to make selective metal technology a more robust process.

FIG. 1 illustrates a contact structure used in accordance with one or more embodiment of the disclosure. The substrate 100 illustrated in FIG. 1 includes a structure 130 bounded by a first material 102 and a second material 104. The structure 130 in the illustrated embodiment is a via or trench. The structure is bounded on the bottom 132 by the first material 102 and on the sides 134 by a second material 104 that is different than the first material 102. The first material 102 of some embodiments comprises a metal 110 which forms a metal bottom 115 of the structure. The metal 110 can be any suitable metal including, but not limited to, tungsten (W), cobalt (Co) and/or copper (Cu). The first material 102, and the bottom 132 of the structure 130 in some embodiments comprises a non-metal. Suitable non-metals include but are not limited to metal nitrides (e.g., titanium nitride (TiN)), metal silicides (e.g., titanium silicide (TiSi)) or silicon (Si). As used in this specification and the appended claims, unless otherwise specified by subscripts, chemical formulae are representative of the elemental identity and are not intended to imply any particular stoichiometric ratios. For example, a titanium nitride (TiN) film can have any suitable combination of titanium and nitrogen atoms and are not limited to a unity relationship.

In some embodiments, the second material 104 comprises a dielectric 120. The sidewalls 134 of the structure 130 are formed by the sidewalls 122 of the dielectric 120. The top surface 106 of the second material 104 is also referred to as the field. In some embodiments, the second material 104 comprises a dielectric 120 with sidewalls 122 and a field 124. The dielectric 120 can be any suitable material including, but not limited to, silicon oxide (SiO), silicon dioxide ($SiO_2$), silicon nitride (SiN), silicon oxynitride (SiON), aluminum nitride (AlN), aluminum oxide (AlO) or a high-k dielectric material. In some embodiments, the second material 104 comprises a hardmask material (e.g., carbon (C)).

Figure 2:
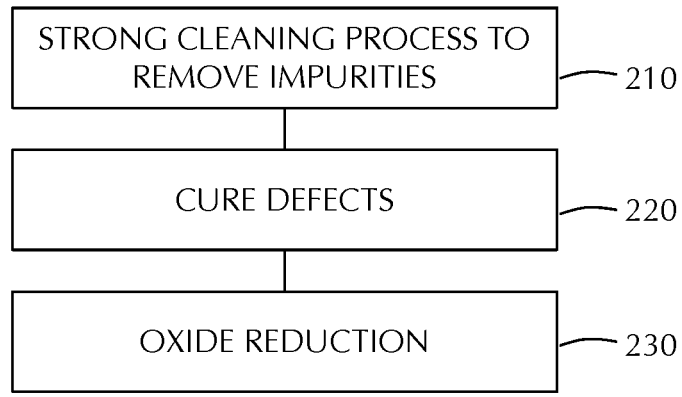
FIG. 2 illustrates a flowchart of a method in accordance with one or more embodiment of the disclosure.
Figures 3A, 3B:
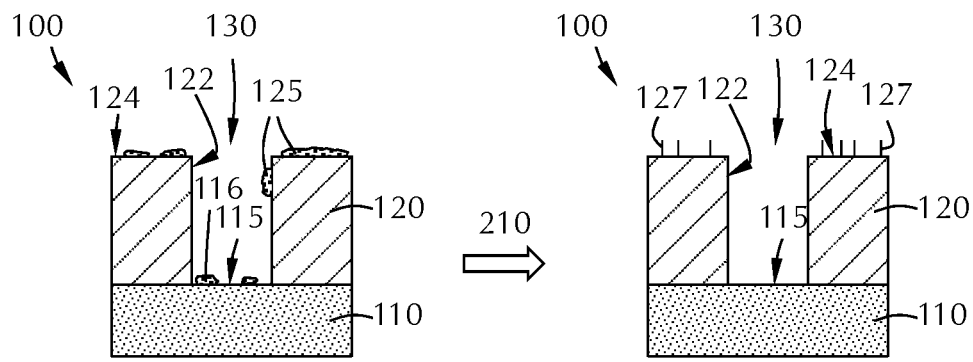
FIGS. 3A through 3D show schematic representations of a substrate during the method of FIG. 2.

FIG. 2 illustrates a method 200 in accordance with one or more embodiment of the disclosure. FIGS. 3A through 3D illustrate the method 200 for pre-cleaning substrate 100 prior to selective deposition. FIG. 3A illustrates the surface structure 130 with a metal surface 115 with surface contaminants 116. The dielectric sidewalls 122 bound the structure 130. In some embodiments, one or more of the dielectric sidewalls 122 or the field 124 has contaminants 125 thereon. The contaminants of some embodiments comprise one or more of oxygen, nitrogen, carbon or halogen (e.g., fluorine, chlorine, bromine or iodine). In some embodiments, the contaminants comprise organic compounds.

Figures 3C, 3D:
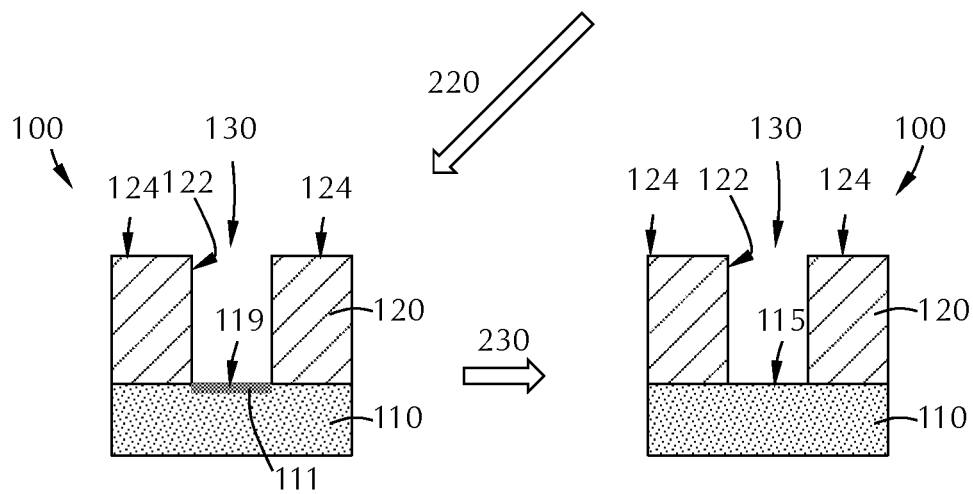
Figure 4A:
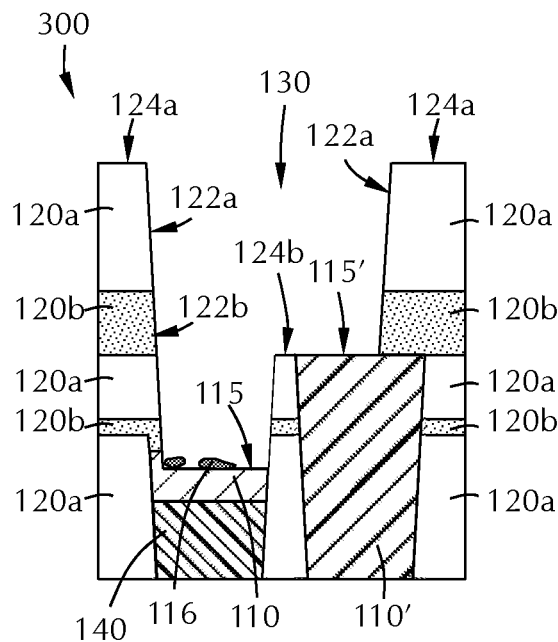
FIGS. 4A through 4D show schematic representations of a substrate during the method of FIG. 2.

FIGS. 4A through 4D illustrate another embodiment of the disclosure. In FIG. 4A, the structure 130 formed in substrate 300 is more complex than that shown in FIG. 3A and includes more than one metal 110, 110'. The skilled artisan will recognize that the embodiment illustrated in FIGS. 3A through 3D and 4A through 4D are merely representative of possible configurations and that the disclosure is not limited to structures as illustrated.

Each of the metals 110, 110' has a surface that forms the metal surface 115, 115' of the structure 130 so that the structure 130 has multiple bottoms at different positions within the structure 130. The embodiment illustrated in FIG. 4A includes a gate 140 below metal 110. The gate 140 is not exposed to the structure 130 and is not affected by the cleaning method 200. The sidewalls 134 of the illustrated structure are made up of several layers of material. Alternating layers of a first dielectric 120a and a second dielectric 120b form the sidewalls 134. The metal bottom illustrated has contaminants 116 and bottom 115' has contaminants 116'.

The method 200 includes a strong cleaning process 210, a curing process 220 and an oxide reduction 230 process. The method 200 proceeds to a strong cleaning process 210 to remove the contaminants 116 from the metal surface 115. In some embodiments, the strong cleaning process 210 removes contaminants 125 from the sidewall 122 and/or field 124 of the dielectric 120.

Figure 4B:
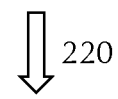
Figure 4B:
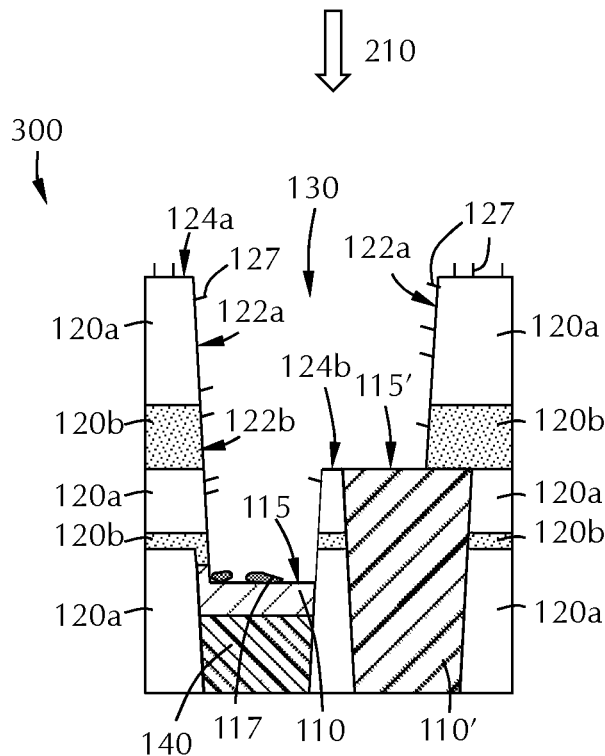

The strong cleaning process 210 of some embodiments results in the substrate 100 illustrated in FIG. 3B. The bottom surface 115 of the metal 110 is cleaned of contaminants. In FIG. 4B, the contaminants 116 on the bottom surface 115 of the metal 110 are decreased from the strong cleaning, leaving some contaminant 117 species on the surface 115 that, for example, are not readily reduced. In the embodiment of FIG. 4B, the contaminants 116' on the metal surface 115' are removed, similar to that shown in FIG. 3B.

The strong cleaning process 210 of some embodiments comprises exposing the substrate 100 to a strong reductant. FIG. 3B illustrates the substrate 100 after exposure to a strong reductant. The strong reductant removes oxides and/or nitrides from the metal surface 115 and creates surface defects 127 in/on the sidewalls 122 and/or field 124 of the dielectric 120. The surface defects 127 of some embodiments comprise hydrogen dangling bonds. FIG. 4B illustrates the substrate 300 after exposure to a strong reductant to form surface defects 127 in/on the sidewalls 122a, 122b and/or field 124a,124b of the dielectric 122a, 122b.

During the cleaning process, damage occurs to the sidewalls and/or field of the dielectric. In some embodiments, the strong cleaning process 210 results in hydrogen (H) dangling bonds on the surface of the dielectric. The hydrogen dangling bonds of some embodiments decreases the selectivity of a deposition process. Stated differently, the hydrogen dangling bonds of some embodiments provide nucleation sites (a source of incubation) resulting in selectivity loss.

In some embodiments, a "strong clean" process comprises exposure to a plasma. In some embodiments, the plasma comprises one or more of hydrogen ($H_2$) or argon (Ar). In some embodiments, the plasma comprises a mixture of hydrogen and argon ($H_2$/Ar) to clean the contamination on the metal surface 115 to form a pure metal surface or a metal surface with a reduced contaminant concentration. The embodiment illustrated in FIG. 3B results in a pure metal surface 115, whereas the embodiment in FIG. 4B shows a metal surface 115, 115' with reduced concentration or modified contaminant 117.

In some embodiments, the strong cleaning process 210 comprises a hydrogen ($H_2$) plasma. In some embodiments, the hydrogen plasma is an inductively coupled plasma (ICP). In some embodiments, the hydrogen plasma is a high density, high energy plasma. In some embodiments, a high energy plasma has a power greater than or equal to 400 watts (W). In some embodiments, the high energy plasma has a power greater than or equal to 450 watts, 500 watts, 550 watts, 600 watts, 650 watts, 700 watts, 750 watts, 800 watts, 850 watts, 900 watts, 950 watts or 1000 watts. In some embodiments, a high density plasma has an ion density greater than or equal to $10^{19}$ ions/m². In some embodiments, a high density plasma has an ion density greater than or equal to $2\times10^{19}$ ions/m², $3\times10^{19}$ ions/m², $4\times10^{19}$ ions/m², $5\times10^{19}$ ions/m², $6\times10^{19}$ ions/m², $7\times10^{19}$ ions/m², $8\times10^{19}$ ions/m², $9\times10^{19}$ ions/m², $1\times10^{20}$ ions/m², $2\times10^{20}$ ions/m², $3\times10^{20}$ ions/m², $4\times10^{20}$ ions/m², or $5\times10^{20}$ ions/m².

In one or more embodiments, the hydrogen plasma has a pressure in the range of 1 mTorr to 50 mTorr, or in the range of 2 mTorr to 40 mTorr, or in the range of 3 mTorr to 30 mTorr or in the range of 4 mTorr to 20 mTorr, or in the range of 5 mTorr to 10 mTorr.

In one or more embodiments, the substrate is maintained at a temperature in the range of 200° C. to 500° C. during exposure to the hydrogen plasma. In some embodiments, the substrate is maintained at a temperature in the range of 250° C. to 450°, or in the range of 300° C. to 400° C. during exposure to the hydrogen plasma.

In some embodiments, a bias is applied to the substrate during the hydrogen plasma. The skilled artisan will understand that a bias is an electromagnetic field that directs ions toward or away from the bias source. In some embodiments, the bias is in the range of 30 W to 300 W applied to the substrate during the hydrogen plasma. In some embodiments, the bias is in the range of 50 W to 280 W, or in the range of 75 W to 260 W, or in the range of 100 W to 250 W.

As the strong cleaning process 210 results in damage to the dielectric, a "cure" process follows. After the strong cleaning process 210, method 200 proceeds to a defect curing process 220 to repair the damage to the dielectric.

The defect curing process 220 of some embodiments comprises exposing the substrate to a reactant that can remove the damage. In some embodiments, the reactant also oxidizes the metal bottom of the structure. In some embodiments, the defect curing process 220 comprises exposing the substrate to an oxygen ($O_2$) plasma. In some embodiments, the oxygen plasma cures the hydrogen dangling bonds caused by the strong cleaning process and oxidizes one or more of the metal and/or dielectric surfaces.

Referring to the embodiment illustrated in FIGS. 3B and 3C, in some embodiments, the substrate 100 is exposed to an oxidizer to repair the surface defects 127 in the sidewalls 122 and/or field 124 of the dielectric. Additionally, the defect curing process 220 of the illustrated embodiment oxidizes the metal surface 115 of the structure 130 to form a metal oxide bottom 111 of the structure 130. The bottom of the structure 130 now having a metal oxide bottom 119.

Figure 4C:
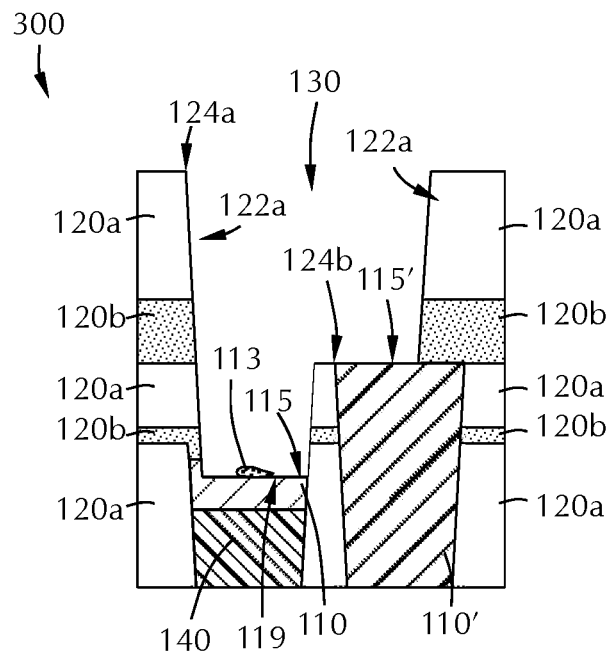

Similarly, in FIGS. 4B and 4C, during the defect curing process 220, going from FIG. 4B to FIG. 4C, the substrate 300 is exposed the oxidizer resulting in curing of the defects 127 and formation of a metal oxide bottom or oxidized contaminants on the metal bottom. In FIG. 4C the contaminant on the bottom of the lower metal 110 surface is a residue 113 that is not initially reduced in the strong cleaning process 210 or fully oxidized in the defect curing process 220. The residue 113 of some embodiments is chemically altered by one or more of the processes 210, 220 so that removal becomes possible in a subsequent process.

In some embodiments, the defect curing process 220 comprises exposing the substrate to an oxidizer. In some embodiments, the oxidizer comprises an oxygen plasma. In some embodiments, the oxidizer consists essentially of oxygen. As used in this manner, the term "consists essentially of oxygen" means that the oxidizing species in the plasma is greater than or equal to about 95%, 98%, 99% or 99.5% oxygen ($O_2$ or ion or radical thereof). Inert, diluent, and/or carrier gases are not considered unless the gaseous species also acts as an oxidizer for the materials present.

In some embodiments, the oxygen plasma is an inductively coupled plasma. In some embodiments, the oxygen plasma is a capacitively coupled plasma. In some embodiments, the oxygen ($O_2$) plasma is a high density, low energy plasma. In some embodiments, a low energy oxygen plasma has a power less than or equal to 200 watts (W). In some embodiments, the low energy oxygen plasma has a power less than or equal to 175 watts, 150 watts, 125 watts, 100 watts, 75 watts, 50 watts or 25 watts. In some embodiments, a high density oxygen plasma has an ion density greater than or equal to $10^{19}$ ions/m$^2$.

In some embodiments, the substrate is maintained at a temperature in the range of $-15°$ C. to $180°$ C. during exposure to the oxygen plasma. In some embodiments, during exposure to the oxygen plasma the substrate is maintained at a temperature in the range of $-10°$ C. to $180°$ C., or in the range of $-5°$ C. to $170°$ C., or in the range of $0°$ C. to $165°$ C., or in the range of $5°$ C. to $160°$ C., or in the range of $10°$ C. to $155°$ C., or in the range of $20°$ C. to $150°$ C., or in the range of $25°$ C. to $125°$ C., or in the range of about $30°$ C. to $100°$ C.

In some embodiments, the oxygen plasma has a pressure in the range of 1 mTorr to 200 mTorr. In some embodiments, the oxygen plasma has a pressure in the range of 2 mTorr to 150 mTorr, or in the range of 3 mTorr to 100 mTorr, or in the range of 5 mTorr to 50 mTorr.

Some embodiments of the disclosure do not include the strong clean process 210 so that the method 200 begins at the curing process 220, or with exposure to the oxidizing plasma.

During the strong clean process 210 and the defect curing process 220, the $O_2$ plasma of some embodiments widens the process window by curing dielectric surface defects and impurities, therefore more aggressive $H_2$ plasma can be used to clean the bottom more efficiently while still maintaining minimal or no growth on the dielectric surface. Experiments showed that a single $H_2$ plasma process (either CCP or ICP) caused different levels of selectivity loss on the dielectric field. With the two-step preclean approach ($O_2$ plasma+$H_2$ plasma) of some embodiments, no selectivity loss was observed, while a via deposited after cleaning remains well grown. In some embodiments of the two-step pre-clean, the method ends after the combination $O_2$/$H_2$ plasma.

The skilled artisan will recognize that an oxygen plasma can effectively decrease the carbon (C) and/or fluorine (F) impurity concentration, both on the metal and dielectric surfaces. Additionally, the inventors have found that curing the dielectric surface reduces impurities and makes the surface more uniformly terminated. In some embodiments, an oxygen plasma is used to produce a clean metal surface and "cure" oxide/dielectric surface. The result of the oxidation of some embodiments is a metal surface 115 oxidized to a metal oxide bottom 119. A subsequent oxide reduction 230 process using a suitable reducing agent (e.g., $H_2$ plasma) can reduce metal oxide bottom 111 to pure metal 110, and further clean other residues 113 (see FIG. 4C) on the metal surface 115.

In some embodiments of the method 200, an oxide reduction process 230 is performed after the defect curing process 220. In the oxide reduction process 230 of some embodiments, the substrate is exposed to a process to reduce metal oxides to metal or remove residues 113 formed on the metal surface. In some embodiments, a hydrogen ($H_2$) thermal anneal is used to reduce metal oxide to metal surface without any damage or any significant damage to the dielectric. Thermal $H_2$ baking is a mild reducing process that is effective to reduce metal oxides to metal without creating dangling bonds in the dielectric.

Figure 4D:
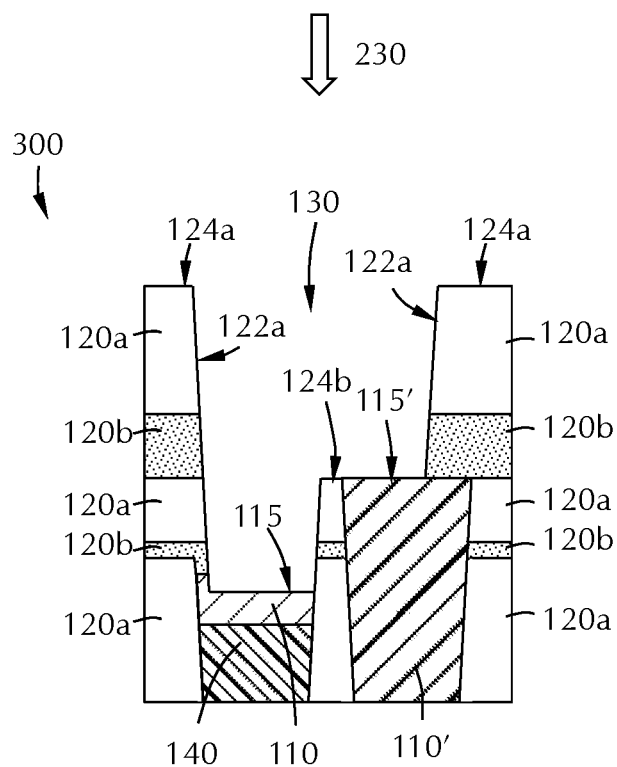

In some embodiments, the oxide reduction process 230 comprises exposing the substrate to a weak reductant to reduce the metal oxide bottom 119 to a metal 115 bottom without substantially damaging the dielectric 120, as illustrated in FIGS. 3C to 3D. In some embodiments, the oxide reduction process 230 comprises exposing the substrate to a weak reductant to remove residues 113 on the metal surface 115 without damaging the dielectric 120, as illustrated in FIGS. 4C to 4D.

In some embodiments, the oxide reduction process 230 comprises a weak reductant. In some embodiments, the weak reductant comprises a hydrogen ($H_2$) plasma. In some embodiments, the hydrogen plasma comprises a conductively coupled plasma (CCP).

In some embodiments, the hydrogen plasma is at a pressure in the range of 1 Torr to 100 Torr. In some embodiments, the hydrogen plasma is at a pressure in the range of 2 Torr to 80 Torr, or in the range of 3 Torr to 60 Torr, or in the range of 4 Torr to 40 Torr, or in the range of 5 Torr to 30 Torr.

In some embodiments, the plasma of the oxide reduction process 230 is a low density, low energy plasma. In some embodiments, a low energy plasma has a power less than or equal to 200 watts (W). In some embodiments, the low energy plasma has a power less than or equal to 175 watts, 150 watts, 125 watts, 100 watts, 75 watts, 50 watts or 25 watts. In some embodiments, a low density plasma has an ion density less than or equal to $10^{19}$ ions/m$^2$. In some embodiments, a low density plasma has an ion density less than or equal to $8 \times 10^{18}$ ions/m$^2$, or $6 \times 10^{18}$ ions/m$^2$, or $4 \times 10^{18}$ ions/m$^2$, or $2 \times 10^{18}$ ions/m$^2$, or $1 \times 10^{18}$ ions/m$^2$.

In some embodiments, the substrate is maintained at a temperature in the range of 300° C. to 550° C. during the oxide reduction process 230. In some embodiments, the substrate is maintained at a temperature in the range of 350° C. to 500° C., or in the range of 400° C. to 450° C. during exposure to the weak reductant during the oxide reduction process 230.

Some embodiments of the method comprise or consist essentially of three processes: a strong clean, and defect cure and an oxide reduction process (also referred to as a weak clean). As used in this manner, the method "consisting essentially of" means that there are no intervening processes that affect the chemical composition of the dielectric surface, dangling bonds, the metal surface, the metal oxide surface, the contaminants or the residues. In one or more embodiments, the strong cleaning process 210 comprises an inductively coupled plasma at 450° C., the defect curing process 220 comprises an inductively coupled plasma at −15° C., and the oxide reduction process 230 comprises a conductively coupled plasma at 450° C. In one or more embodiments, the strong cleaning process 210 comprises an inductively coupled plasma at 450° C., the defect curing process 220 comprises an inductively coupled plasma at 120° C., and the oxide reduction process 230 comprises a conductively coupled plasma at 450° C.

In some embodiments, the integrated, multi-step preclean method illustrated in FIG. 2, efficiently cleans residues and enhances selectivity of a subsequent deposition process. In some embodiments, an oxygen plasma is used to alleviate selectivity loss issues by cleaning impurities/dangling bonds and terminating the metal and/or dielectric surface as uniform oxide. In some embodiments of this sort, one or more of alcohol, water or ozone treatment is used to widen the selectivity window. In some embodiments, the method comprises or consists essentially of a $H_2$/Ar plasma, an oxygen plasma and a tungsten hexafluoride soak. In some embodiments of this sort, the tungsten hexafluoride soak improves the condition of specific metal bottom (e.g., tungsten). In some embodiments, the $WF_6$ is exposed to the substrate at a pressure in the range of 30 Torr to 300 Torr. In some embodiments, the substrate is maintained at a temperature in the range of 300° C. to 600° C. during exposure to the $WF_6$.

Various hardware arrangements can be used to implement the method 200. In some embodiments, for surface cleaning, one or two chambers can be applied to achieve multiple processes. Chambers can be used for $O_2$/Ar/$H_2$ plasma treatments with different gas species. $H_2$ and $O_2$ treatment in some embodiments are performed in one chamber with designated gas panel design and low pressure is maintained to avoid extra moisture formation. In some embodiments, the $H_2$ bake (anneal) is performed in the same chamber as either $H_2$ plasma or in a tungsten CVD chamber.

One or more embodiments of the disclosure provide more robust solutions to target more selective deposition applications. Different structures have different selectivities with varied metal/oxide surface conditions. Some application will not have selectivity window for selective W if using only H or Ar plasma.

Figure 5:
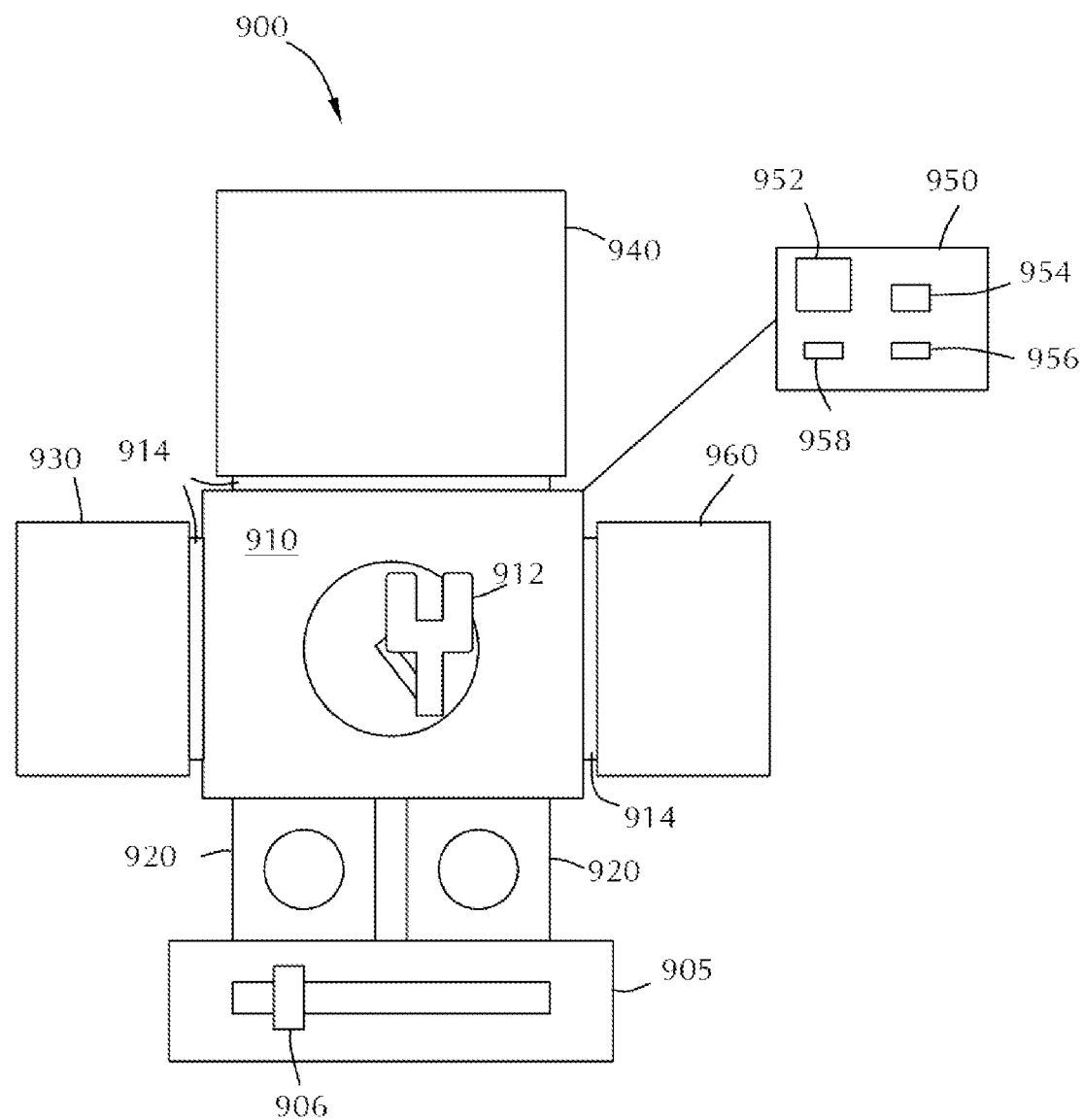
FIG. 5 illustrates a schematic representation of a processing tool for use with one or more embodiments of the disclosure.

With reference to FIG. 5, additional embodiments of the disclosure are directed to a processing system 900 for executing the methods described herein. FIG. 5 illustrates a system 900 that can be used to process a substrate according to one or more embodiment of the disclosure. The system 900 can be referred to as a cluster tool. The system 900 includes a central transfer station 910 with a robot 912 therein. The robot 912 is illustrated as a single blade robot; however, those skilled in the art will recognize that other robot 912 configurations are within the scope of the disclosure. The robot 912 is configured to move one or more substrate between chambers connected to the central transfer station 910.

At least one pre-clean/buffer chamber 920 is connected to the central transfer station 910. The pre-clean/buffer chamber 920 can include one or more of a heater, a radical source or plasma source. The pre-clean/buffer chamber 920 can be used as a holding area for an individual semiconductor substrate or for a cassette of wafers for processing. The pre-clean/buffer chamber 920 can perform pre-cleaning processes or can pre-heat the substrate for processing or can simply be a staging area for the process sequence. In some embodiments, there are two pre-clean/buffer chambers 920 connected to the central transfer station 910. In some embodiments, the pre-clean chambers are used in one or more of the processes of method 200.

In the embodiment shown in FIG. 5, the pre-clean chambers 920 can act as pass through chambers between the factory interface 905 and the central transfer station 910. The factory interface 905 can include one or more robot 906 to move substrate from a cassette to the pre-clean/buffer chamber 920. The robot 912 can then move the substrate from the pre-clean/buffer chamber 920 to other chambers within the system 900.

A first processing chamber 930 can be connected to the central transfer station 910. In some embodiments, the first processing chamber 930 is configured to perform one or more of the strong clean process 210, the defect curing process 220 or the oxide reduction process 230. The first processing chamber 930 is in fluid communication with one or more reactive gas sources to provide one or more flows of reactive gases to the first processing chamber 930 depending on the process or processes for which it is configured. The substrate can be moved to and from the processing chamber 930 by the robot 912 passing through isolation valve 914.

Processing chamber 940 can also be connected to the central transfer station 910. In some embodiments, processing chamber 940 is configured to perform one or more of the strong clean process 210, the defect curing process 220 or the oxide reduction process 230 and is fluid communication with one or more reactive gas sources to provide flows of reactive gas to the processing chamber 940 to perform the subject process. The substrate can be moved to and from the processing chamber 940 by robot 912 passing through isolation valve 914.

Processing chamber 945 can also be connected to the central transfer station 910. In some embodiments, the processing chamber 945 is configured to perform one or more of the strong clean process 210, the defect curing process 220 or the oxide reduction process 230. In some embodiments, processing chamber 945 is configured to perform the same process as processing chamber 930 or processing chamber 940. This arrangement might be useful where the process occurring in processing chamber 940 takes much longer than the process in processing chamber 930.

In some embodiments, processing chamber 960 is connected to the central transfer station 910 and is configured to perform one or more of the strong clean process 210, the defect curing process 220 or the oxide reduction process 230. The processing chamber 960 can be configured to perform one or more of the same or different processes than any of the other process chambers.

In some embodiments, each of the processing chambers 930, 940, 945 and 960 are configured to perform different portions of the processing method. For example, in some embodiments, processing chamber 930 is configured to perform the strong cleaning process 210, processing chamber 940 is configured to perform defect curing process 220, and processing chamber 945 is configured to perform the oxide removal process 230. The skilled artisan will recognize that the number and arrangement of individual processing chamber on the tool can be varied and that the embodiment illustrated in FIG. 5 is merely representative of one possible configuration.

At least one controller 950 is coupled to one or more of the central transfer station 910, the pre-clean/buffer chamber 920, processing chambers 930, 940, 945, or 960. In some embodiments, there are more than one controller 950 connected to the individual chambers or stations and a primary control processor is coupled to each of the separate processors to control the system 900. The controller 950 may be one of any form of general-purpose computer processor, microcontroller, microprocessor, etc., that can be used in an industrial setting for controlling various chambers and sub-processors.

The at least one controller 950 can have a processor 952, a memory 954 coupled to the processor 952, input/output devices 956 coupled to the processor 952, and support circuits 958 to communication between the different electronic components. The memory 954 can include one or more of transitory memory (e.g., random access memory) and non-transitory memory (e.g., storage).

The memory 954, or computer-readable medium, of the processor may be one or more of readily available memory such as random access memory (RAM), read-only memory (ROM), floppy disk, hard disk, or any other form of digital storage, local or remote. The memory 954 can retain an instruction set that is operable by the processor 952 to control parameters and components of the system 900. The support circuits 958 are coupled to the processor 952 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 950 has one or more configurations to execute individual processes or sub-processes to perform the method. The controller 950 can be connected to and configured to operate intermediate components to perform the functions of the methods. For example, the controller 950 can be connected to and configured to control one or more of gas valves, actuators, motors, slit valves, vacuum control, etc.

The controller 950 of some embodiments has one or more configurations selected from: a configuration to move a substrate on the robot between the plurality of processing chambers and metrology station; a configuration to load and/or unload substrates from the system; a configuration to move a substrate between and among the central transfer station, a first process chamber, a second process chamber and a third process chamber; a configuration to perform a strong reduction process in the first process chamber; a configuration to perform an oxidation process in the second process chamber; and a configuration to perform a weak reduction process in the third process chamber. The locations of the various processing chambers is not limited to that embodiment illustrated in FIG. 5, as will be well understood by the skilled artisan.

One or more embodiments of the disclosure are directed to processing tools comprising a central transfer station including a robot configured to move a substrate between process chambers. A first process chamber is connected to the central transfer station and is configured to perform a strong reduction process to remove surface contaminants from a metal surface and create defects in a dielectric sidewall. A second process chamber is connected to the central transfer station and is configured to perform an oxidation process to repair defects in the dielectric sidewall and oxidize the metal surface to form a metal oxide. A third process chamber is connected to the central transfer station and is configured to perform a weak reduction process to reduce the metal oxide to pure metal without substantially damaging the dielectric. At least one controller is connected to the central transfer station, the first process chamber, the second process chamber and the third process chamber. The at least one controller has one or more configurations selected from: a configuration to move a substrate between and among the central transfer station, the first process chamber, the second process chamber and the third process chamber; a configuration to perform the strong reduction process in the first process chamber; a configuration to perform the oxidation process in the second process chamber; and a configuration to perform the weak reduction process in the third process chamber.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of pre-cleaning a substrate, the method comprising:

exposing a substrate having a dielectric field and a surface structure with a metal bottom and dielectric sidewalls to a strong reductant to remove oxide and/or nitride from the metal bottom and create surface defects in the dielectric sidewalls and/or dielectric field;

exposing the substrate to an oxidizer to repair the surface defects in the dielectric sidewalls and/or dielectric field and oxidize the metal bottom of the surface structure to form a metal oxide bottom of the surface structure; and exposing the substrate to a weak reductant to reduce the metal oxide bottom to a pure metal bottom without substantially damaging the dielectric.

2. The method of claim 1, wherein the strong reductant comprises a hydrogen plasma.

3. The method of claim 2, wherein the hydrogen plasma is an inductively coupled plasma.

4. The method of claim 2, wherein the hydrogen plasma is a high density, high energy plasma.

5. The method of claim 2, wherein the hydrogen plasma has a pressure in a range of 5 mTorr to 10 mTorr.

6. The method of claim 2, wherein the substrate is maintained at a temperature in a range of 200° C. to 500° C. during the hydrogen plasma.

7. The method of claim 2, wherein a bias in a range of 30 W to 300 W is applied to the substrate during the hydrogen plasma.

8. The method of claim 1, wherein the oxidizer comprises an oxygen plasma.

9. The method of claim 8, wherein the substrate is maintained at a temperature in a range of −15° C. to 180° C. during exposure to the oxygen plasma.

10. The method of claim 8, wherein the oxygen plasma is a conductively coupled plasma (CCP) or an inductively coupled plasma (ICP).

11. The method of claim 10, wherein the oxygen plasma is a high density, low energy plasma.

12. The method of claim 10, wherein the oxygen plasma has a pressure in a range of 5 mTorr to 50 mTorr.

13. The method of claim 1, wherein the weak reductant comprises a hydrogen plasma.

14. The method of claim 13, wherein the hydrogen plasma comprises a conductively coupled plasma (CCP).

15. The method of claim 14, wherein the plasma is at a pressure in a range of 5 Torr to 30 Torr.

16. The method of claim 14, wherein the plasma is a low density, low energy plasma.

17. The method of claim 14, wherein the substrate is maintained at a temperature in a range of 400° C. to 450° C. during exposure to the weak reductant.

18. The method of claim 1, wherein the dielectric comprises one or more of silicon nitride (SiN), silicon oxide (SiO), silicon oxynitride (SiON) or a high-k dielectric, and the metal comprises one or more of tungsten (W) or cobalt (Co).

* * * * *